(12) United States Patent  
Weng et al.

(10) Patent No.: US 9,128,218 B2  
(45) Date of Patent: Sep. 8, 2015

(54) MICROLENS STRUCTURE AND FABRICATION METHOD THEREOF

(75) Inventors: Fu-Tien Weng, Hsinchu (TW); Yu-Kun Hsiao, Hsinchu (TW)

(73) Assignee: VisEra Technologies Company Limited, Hsinchu Science Park (TW)

( * ) Notice: Subject to any disclaimer, the term of this patent is extended or adjusted under 35 U.S.C. 154(b) by 72 days.

(21) Appl. No.: 13/340,178

(22) Filed: Dec. 29, 2011

(65) Prior Publication Data

US 2013/0170047 A1    Jul. 4, 2013

(51) Int. Cl.
```
G02B 27/10    (2006.01)
G02B 3/00     (2006.01)
C23C 16/40    (2006.01)
G02B 1/115    (2015.01)
H01L 27/146   (2006.01)
C23C 16/02    (2006.01)
C23C 16/505   (2006.01)
```

(52) U.S. Cl.
CPC .......... *G02B 3/0006* (2013.01); *C23C 16/0272* (2013.01); *C23C 16/402* (2013.01); *C23C 16/505* (2013.01); *G02B 1/115* (2013.01); *G02B 3/0012* (2013.01); *H01L 27/14627* (2013.01)

(58) Field of Classification Search
USPC ................. 359/618–620; 257/432, 436–437; 250/208.1
See application file for complete search history.

(56) References Cited

U.S. PATENT DOCUMENTS

| | | | |
|---|---|---|---|
| 5,679,592 A | 10/1997 | Kang | |
| 6,171,883 B1 | 1/2001 | Fan et al. | |
| 6,287,430 B1 | 9/2001 | Matsumoto et al. | |
| 6,307,243 B1* | 10/2001 | Rhodes | 257/432 |
| 6,831,311 B2* | 12/2004 | Uchida | 257/436 |
| 7,005,627 B2* | 2/2006 | Lim | 250/208.1 |
| 2004/0105155 A1 | 6/2004 | Hori et al. | |
| 2006/0023313 A1* | 2/2006 | Kim | 359/620 |
| 2007/0117359 A1* | 5/2007 | Todd | 438/485 |
| 2008/0088932 A1 | 4/2008 | Cho et al. | |
| 2009/0232985 A1 | 9/2009 | Dussarrat et al. | |
| 2010/0289939 A1 | 11/2010 | Ogino et al. | |

FOREIGN PATENT DOCUMENTS

| | | |
|---|---|---|
| CN | 101888489 A | 10/2010 |
| JP | 04-062501 | 2/1992 |
| JP | 04-223371 | 8/1992 |
| JP | 08-186260 | 7/1996 |

(Continued)

OTHER PUBLICATIONS

K.D. Mackenzie et al ; Inductively-Coupled Plasma Deposition of Low Temperature Silicon Dioxide and Silicon Nitride films for III-V Applications, May 1999, pp. 1-12.*

(Continued)

*Primary Examiner* — Alicia M Harrington  
(74) *Attorney, Agent, or Firm* — Muncy, Geissler, Olds & Lowe, P.C.

(57) ABSTRACT

A microlens structure is provided. The microlens structure includes a microlens element having a first refraction index. A first film is disposed on the microlens element, wherein the first film has a second refraction index less than the first refraction index. A second film is disposed on the first film, wherein the second film has a third refraction index less than the second refraction index and greater than a refraction index of air. Further, a fabrication method of the microlens structure is also provided.

18 Claims, 2 Drawing Sheets

(56) References Cited

FOREIGN PATENT DOCUMENTS

| | | |
|---|---|---|
| JP | 11-131240 A | 5/1999 |
| JP | 2000-017457 | 1/2000 |
| JP | 2002 299594 | 10/2002 |
| JP | 2005 534179 | 11/2005 |
| JP | 2006003562 A | 1/2006 |
| JP | 2009 006521 | 1/2009 |
| JP | 2010267770 | 11/2010 |
| JP | 2011-017782 | 1/2011 |
| JP | 2011 237472 | 11/2011 |
| WO | WO 2004/010467 | 1/2004 |
| WO | WO 2004027849 | 4/2004 |
| WO | WO 2011/153484 | 12/2011 |

OTHER PUBLICATIONS

W.J. Patrick et al., "Plasma-Enhanced Chemical Vapor Deposition of Silicon Dioxide Films Using Tetraethoxysilane and Oxygen: Characterization and Properties of Films," J. Electrochem. Soc., vol. 139, No. 9, Sep. 1992, pp. 2604-2613.

Li Li, "The study of the deposition of $SiO_2$ films with RF cold plasma at atmospheric-pressure," Mar. 15, 2007, 40 pages.

Office Action issued on Jul. 3, 2014 by the Chinese Patent Office in corresponding application No. 201210105746.X.

CN Office Action from corresponding CN Appl No. 201210105746 dated Mar. 25, 2015, 7 pp.

JP Office Action from corresponding JP Appl No. 2012-241666 dated May 19, 2015, 3 pp.

\* cited by examiner

MICROLENS STRUCTURE AND FABRICATION METHOD THEREOF

BACKGROUND OF THE INVENTION

1. Field of the Invention

The invention relates to a microlens structure and more particularly to a microlens structure having a multi-layered refraction film on a microlens element and a method for forming the multi-layered refraction film.

2. Description of the Related Art

In image sensor devices, a microlens structure is usually disposed on an image sensor chip. The conventional microlens structure has a microlens element and only one layer of an Silicon oxide film with one refraction index is formed on the microlens element.

In a conventional method, the silicon oxide film is formed by coating a liquid oxide material onto the microlens element and then performing a hard baking process to the liquid oxide material to form the silicon oxide film on the microlens element. However, the silicon oxide film formed by this conventional method has a poor step coverage ratio of less than 60%, thus the silicon oxide film is easy delaminated from the microlens element.

In another conventional method, the silicon oxide film is formed by a plasma enhanced chemical vapor deposition (PECVD) process using a process temperature higher than 200° C., a radio frequency (RF) power higher than 300 watt, a rich $O_2$ environment of $O_2$ flow rate of 2000 standard cubic centimeter per minute (sccm) and a gas source of silane ($SiH_4$) and $N_2O$ or a gas source of tetraethyl orthosilicate (TEOS) and $O_2$. However, the high process temperature, the high RF power and the rich $O_2$ environment used in the conventional PECVD process damages the organic material layer under the microlens element. Also, the silicon oxide film formed by the PECVD process using the gas source of $SiH_4$ and $N_2O$ has a poor step coverage ratio of less than 70%. The silicon oxide film formed by the PECVD process using the gas source of TEOS and $O_2$ has a poor step coverage ratio of less than 80%. Thus, the silicon oxide film is also easily delaminated from the microlens element.

Furthermore, the sensitivity of the image sensor device cannot be greatly enhanced by the silicon oxide film with one refraction index. The stress of the silicon oxide film with one-layered structure cannot be adjusted to get optimum stress performance for a large process window of the microlens structure.

Therefore, a microlens structure and a fabrication method of the microlens structure which overcomes the above problems are desired.

BRIEF SUMMARY OF THE INVENTION

In an exemplary embodiment, a microlens structure is provided. The microlens structure comprises a microlens element having a first refraction index. A first film is disposed on the microlens element, wherein the first film has a second refraction index less than the first refraction index. Further, a second film is disposed on the first film, wherein the second film has a third refraction index less than the second refraction index and greater than a refraction index of air.

In an exemplary embodiment, a method for fabricating a microlens structure is provided. The method comprises: forming a microlens element having a first refraction index; depositing a first film on the microlens element, wherein the first film has a second refraction index less than the first refraction index; and depositing a second film on the first film, wherein the second film has a third refraction index less than the second refraction index and greater than a refraction index of air.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
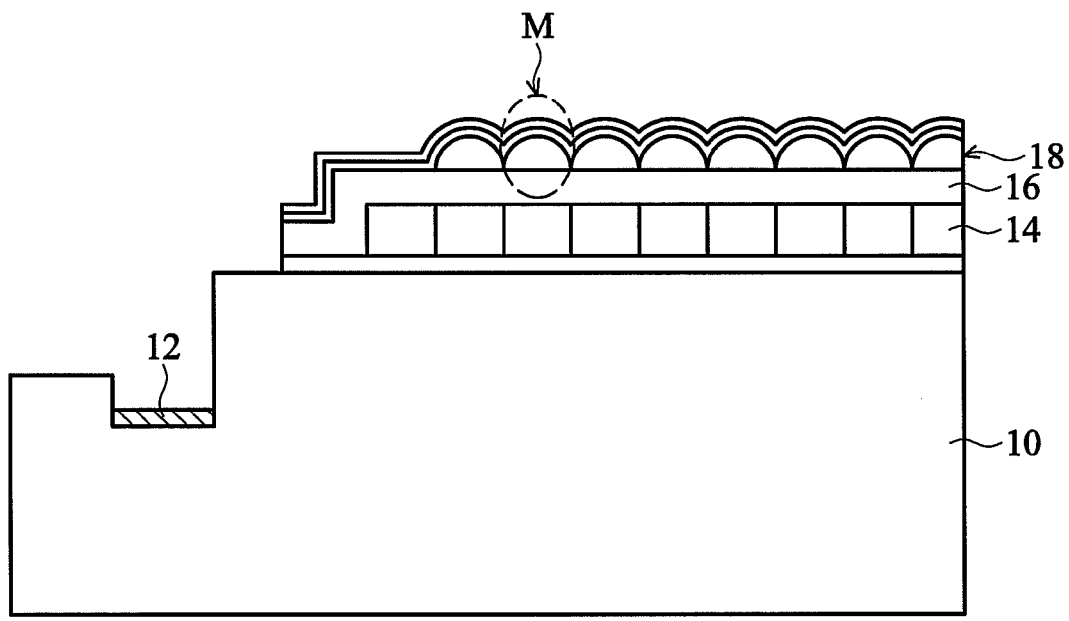
FIG. 1 shows a schematic partial cross section of a microlens structure disposed on an image sensor according to an embodiment of the invention.

An exemplary embodiment of the invention provides a microlens structure which may be disposed on an image sensor to increase the luminous flux on the image sensor, such that the sensitivity, i.e. signal to noise ration, of the image sensor is enhanced by at least 3-6%. Referring to FIG. 1, a partial cross section of a microlens structure 18 disposed on an image sensor 10 according to an embodiment of the invention is shown. Moreover, a color filter 14 and a spacer 16 are disposed between the image sensor 10 and the microlens structure 18, wherein the microlens structure 18 is disposed on the spacer 16. The image sensor 10 has a bond pad 12 exposed for electrically connecting with an external circuit (not shown).

Figure 2:
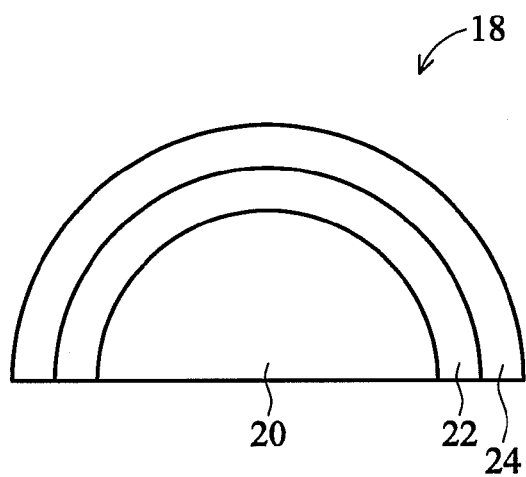
FIG. 2 shows a schematic enlarged cross section of a portion M of the microlens structure of FIG. 1 according to an embodiment of the invention.

Referring to FIG. 2, an enlarged cross section of a portion M of the microlens structure 18 of FIG. 1 according to an embodiment of the invention is shown. The microlens structure 18 includes a microlens element 20 having a first refraction index N1. In an embodiment, the first refraction index N1 is about 1.55. The microlens element 20 consists of a plurality of microlens units arranged into an array. In an embodiment, the thickness t1 of the microlens element 20 is about 0.35 μm to about 1.0 μm.

The microlens structure 18 further includes a first film 22 disposed on the microlens element 20 and a second film 24 disposed on the first film 22. The first film 22 has a second refraction index N2 less than the first refraction index N1 and the second film 24 has a third refraction index N3 less than the second refraction index N2 and greater than a refraction index N* of air, i.e. N1 (about 1.55)>N2>N3>N*(=1.0). In an embodiment: the first refraction index N1 of the microlens element 20 is about 1.55; the second refraction index N2 of the first film 22 is about 1.45; the third refraction index N3 of the second film 24 is about 1.40; and the refraction index of air is 1.0. The first film 22 may be an $SiO_2$, film. The second film 24 may be a diamond porous film, a non-organic film or a film formed from other materials having a refraction index between N2 and a refraction index of a film adjacent to the second film 24. In an embodiment, the first film 22 has a thickness t2 of at least 500 Å and the second film 24 has a thickness t3 of at least 500 Å. A total thickness of the first film 22 and the second film 24 is about 0.1 μm to about 0.2 μm.

In an embodiment, the first film 22 may be an $SiO_2$ film formed from an initial film (not shown) on the microlens element 20 and a bulk film (not shown) on the initial film by performing a plasma enhanced chemical vapor deposition (PECVD) process twice. The initial film has a thickness of about 50 Å to about 100 Å and the bulk film has a thickness greater than the thickness of the initial film. In an exemplary embodiment, the step of depositing the initial film uses a gas source of tetraethyl orthosilicate (TEOS) and $O_2$, a process temperature lower than 200□, for example about 180□, a radio frequency (RF) power not greater than 250 watt and an $O_2$ flow rate of about 250-1000 standard cubic centimeter per minute (sccm). The initial film formed by the above process conditions has a tensile (positive) stress and a concave state. The step of depositing the bulk film uses a gas source of tetraethyl orthosilicate (TEOS) and $O_2$, a process temperature lower than 200□, for example about 180□, a radio frequency (RF) power greater than 250 watt and an $O_2$ flow rate of about 250-2000 standard cubic centimeter per minute (sccm). The bulk film formed by the above process conditions has a compressive (negative) stress and a convex state. Therefore, the stress of the initial film is balanced off by the stress of the bulk film and the stress of the first film 22 can be optimized. Then, the second film 24 is formed to have a stress to balance off the stress of the first film 22. The second film 24 can be formed by any suitable thin film deposition or coating process.

In another embodiment, the first film 22 may be an $SiO_2$ film formed by performing a low temperature chemical vapor deposition (LTCVD) process once. The step of forming the $SiO_2$ film uses a gas source of bis(diethylamido) silane and $O_3$ and a process temperature of about 70□ to about 180□. The production rate of the process temperature of 180□ is 5 times the production rate of the process temperature of 70□. The gas source of bis(diethylamido) silane and $O_3$ used in the LTCVD process is a new material. The LTCVD process using the new material can replace the conventional PECVD process with a high temperature, a high RF power and a rich $O_2$ environment to avoid damaging the organic material layer, for example avoid damaging the spacer 16, under the microlens element 20. Moreover, bis(diethylamido) silane used in the LTCVD process has a better mobility than TEOS used in the PECVD process. Thus, the LTCVD process using the gas source of bis(diethylamido) silane and $O_3$ can form a robust $SiO_2$ film on the microlens element 20. Moreover, the LTCVD process using the gas source of bis(diethylamido) silane and $O_3$ is suitable for the microlens element 20 having a gap between any two adjacent microlens units lower than 0.1 μm. The first film 22 formed by the above LTCVD process conditions has a compressive (negative) stress and a convex state. In order to balance off the stress of the first film 22, the second film 24 is formed to have a tensile (positive) stress and a concave state. The second film 24 is formed to have a stress to balance off the stress of the first film 22. The second film 24 can be formed by any suitable thin film deposition or coating process.

In an embodiment, the first film 22 may be an $SiO_2$ film formed from an initial film (not shown) on the microlens element 20 and a bulk film (not shown) on the initial film. The initial film has a thickness of about 50 Å to about 100 Å and the bulk film has a thickness greater than the thickness of the initial film. The initial film is formed by a low temperature chemical vapor deposition (LTCVD) process and the bulk film is formed by a plasma enhanced chemical vapor deposition (PECVD) process. The LTCVD process for forming the initial film uses a gas source of bis(diethylamido) silane and $O_3$ and a process temperature of 70-180□. The PECVD process for forming the bulk film uses a gas source of tetraethyl orthosilicate (TEOS) and $O_2$, a process temperature lower than 200□, for example about 180□, a radio frequency (RF) power greater than 250 watt and an $O_2$ flow rate of about 250-2000 standard cubic centimeter per minute (sccm).

According to the embodiments of the invention, the first film 22 or the initial film of the first film 22 is formed by the PECVD process with a process temperature lower than 200□, a radio frequency (RF) power not greater than 250 watt and an $O_2$ flow rate of about 250-1000 sccm, or by the LTCVD process using a gas source of bis(diethylamido) silane and $O_3$ and a process temperature of 70-180□. Therefore, the spacer 16 under the microlens structure 18 is not damaged by the deposition of the first film 22. In addition, the deposition processes of the following layers on the first film 22 or the initial film of the first film 22 are not constrained by the process temperature, the RF power or the $O_2$ flow rate due to the spacer 16 under the microlens structure 18 being isolated and protected by the first film 22 or the initial film of the first film 22.

Moreover, the above mentioned processes for forming the first film 22 or the initial film of the first film 22 have excellent step coverage ability to fill a gap between any two microlens units of the microlens structure 18. Therefore, after depositing the first film 22, a fill-factor of the gap between any two microlens units of the microlens structure 18 is greater than 99% and a surface area of the microlens structure 18 is greater than a surface area of the microlens element 20 to increase the luminous flux on the image sensor 10.

Figure 3:
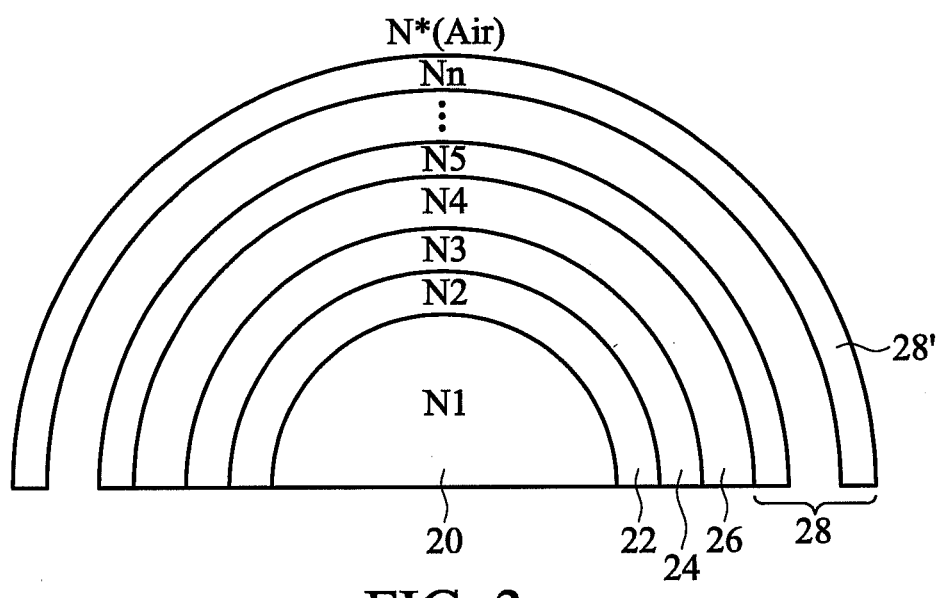
FIG. 3 shows a schematic enlarged cross section of a portion of a microlens structure according to another embodiment of the invention.

Although the microlens structure 18 of FIG. 2 is illustrated with the first film 22 and the second film 24 on the microlens element 20, more films can be deposited on the second film 24 for the microlens structure 18. In an embodiment, as shown in FIG. 3, the microlens structure further includes a third film 26 disposed on the second film 24. The third film has a fourth refraction index N4 less than the third refraction index N3 and greater than the refraction index N* of air, i.e. N1 (about 1.55)>N2>N3>N4>N*(=1.0). For example, the third refraction index N3 of the second film 24 is 1.40 and the fourth refraction index N4 of the third film is 1.30. The material of the third film 26 can be any suitable material which is transparent and has a refraction index N4 of 1.3 or less than 1.40.

In another embodiment, as shown in FIG. 3, the microlens structure further includes a plurality of films 28 disposed on the third film 26, wherein each of the films 28 on the third film 26 has a refraction index N5, ... or Nn less than the fourth refraction index N4 of the third film and greater than the refraction index N* of air, i.e. N1 (about 1.55)>N2>N3>N4>N5> ... >Nn.>N*(=1.0). For example, the fourth refraction index N4 of the third film 26 may be 1.30 and the refraction indexes N5 ... and Nn of the films 28 on the third film 26 are less than 1.30 and greater than 1.0. The refraction indexes N5 ... and Nn of the films 28 on the third film 26 are gradually decreased from the refraction index N5 less than the fourth refraction index N4 to the refraction index Nn greater than the refraction index N* of air. The most outer film 28' of the films 28 on the microlens element 20 has the smallest refraction index Nn which is greater than the refraction index N* of air. A total thickness of the first film 22, the second film 24, the third film and the plurality of films disposed on the third film is about 0.1 nm to about 0.2 μm.

According to the embodiments of the invention, a multi-layered film consisting of the first film 22 and the second film 24 or even the additional third film 26 and the additional films 28 on the third film 26 is disposed on the microlens element 20. The multi-layered film has refraction indexes which gradually decrease from the refraction index N2 less than the refraction index N1 of the microlens element 20 to the refraction index Nn greater than the refraction index N* of air. Thus, the multi-layered film on the microlens element 20 can increase the luminous flux on the image sensor 10 to enhance the sensitivity of the image sensor 10.

Moreover, the stress of each layer of the multi-layered film on the microlens element 20 can be adjusted by different thicknesses and by a deposition process using different materials, different deposition methods or different process conditions. Thus, the multi-layered film integrated with the performance of the stress of the multi-layered film can get optimum overall performance of the multi-layered film on the microlens element 20 to achieve a large process window for the microlens structure 18.

In the embodiments of the invention, before depositing the first film 22 on the microlens element 20, the bond pad 12 of the image sensor 10 is covered with a planarization layer (not shown) for protection. After the deposition processes of the multi-layered film are completed, a patterned protective layer (not shown) is formed on the multi-layered film above the microlens element 20. Then, the planarization layer and other layers not covered with the patterned protective layer and disposed on the bond pad 12 are removed by an etching process. The bond pad 12 is exposed and the multi-layered film is patterned. Next, the patterned protective layer is removed to complete the fabrication of the microlens structure 18.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of forming a microlens structure, comprising:
    forming a microlens element having a first refraction index;
    conformally depositing a first film on the microlens element by a chemical vapor deposition at a process temperature lower than 200° C. to form a $SiO_2$ film, wherein the first film has a second refraction index less than the first refraction index, and an initial film of the first film of the $SiO_2$ film is formed by a plasma enhanced chemical vapor deposition process using a gas source of tetraethyl orthosilicate (TEOS) and $O_2$, a radio frequency (RF) power less than 250 watt and an $O_2$ flow rate of 250-1000 standard cubic centimeter per minute (sccm); and
    conformally depositing a second film on the first film, wherein the second film has a third refraction index less than the second refraction index and greater than a refraction index of air.

2. The method as claimed in claim 1, wherein the step of forming the $SiO_2$ film further comprises depositing a bulk film of the first film on the initial film, and the initial film has a thickness less than a thickness of the bulk film.

3. The method as claimed in claim 2, wherein the bulk film of the first film of the $SiO_2$ film is formed by a plasma enhanced chemical vapor deposition process using a gas source of tetraethyl orthosilicate (TEOS) and $O_2$, a radio frequency (RF) power greater than 250 watt and an $O_2$ flow rate of 250-2000 standard cubic centimeter per minute (sccm).

4. The method as claimed in claim 3, wherein the bulk film has a compressive stress.

5. The method as claimed in claim 1, wherein the initial film has a tensile stress.

6. The method as claimed in claim 1, wherein the stress of the first film is balanced off by a stress of the second film.

7. The method as claimed in claim 1, further comprising depositing a third film on the second film, wherein the third film has a fourth refraction index less than the third refraction index and greater than the refraction index of air.

8. The method as claimed in claim 7, wherein the stress of the second film is balanced off by a stress of the third film.

9. The method as claimed in claim 7, further comprising depositing a plurality of films on the third film, wherein each of the films on the third film has a refraction index less than the fourth refraction index and greater than the refraction index of air, and the refraction indexes of the films on the third film are gradually decreased from the fourth refraction index to the refraction index of air.

10. A method of forming a microlens structure, comprising:
    forming a microlens element having a first refraction index;
    conformally depositing a first film on the microlens element by a chemical vapor deposition to form a $SiO_2$ film, wherein the first film has a second refraction index less than the first refraction index, and an initial film of the first film of the $SiO_2$ film is formed by a low temperature chemical vapor deposition process using a gas source of bis(diethylamido) silane and $O_3$ at a process temperature of 70-180° C.; and
    conformally depositing a second film on the first film, wherein the second film has a third refraction index less than the second refraction index and greater than a refraction index of air.

11. The method as claimed in claim 10, wherein the step of forming the $SiO_2$ film further comprises depositing a bulk film of the first film on the initial film, and the initial film has a thickness less than a thickness of the bulk film.

12. The method as claimed in claim 11, wherein the bulk film of the first film of the $SiO_2$ film is formed by the low temperature chemical vapor deposition process using the gas source of bis(diethylamido) silane and $O_3$ at the process temperature of 70-180° C.

13. The method as claimed in claim 12, wherein the first film has a compressive stress and the second film has a tensile stress.

14. The method as claimed in claim 11, wherein the bulk film of the first film of the $SiO_2$ film is formed by a plasma enhanced chemical vapor deposition process.

15. The method as claimed in claim 10, wherein the stress of the first film is balanced off by a stress of the second film.

16. The method as claimed in claim 10, further comprising depositing a third film on the second film, wherein the third film has a fourth refraction index less than the third refraction index and greater than the refraction index of air.

17. The method as claimed in claim 16, wherein the stress of the second film is balanced off by a stress of the third film.

18. The method as claimed in claim 16, further comprising depositing a plurality of films on the third film, wherein each of the films on the third film has a refraction index less than the fourth refraction index and greater than the refraction index of air, and the refraction indexes of the films on the third film are gradually decreased from the fourth refraction index to the refraction index of air.

* * * * *